(12) United States Patent
Voldman

(10) Patent No.: US 8,015,518 B2
(45) Date of Patent: Sep. 6, 2011

(54) STRUCTURES FOR ELECTROSTATIC DISCHARGE PROTECTION FOR BIPOLAR SEMICONDUCTOR CIRCUITRY

(75) Inventor: Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 586 days.

(21) Appl. No.: 12/108,165

(22) Filed: Apr. 23, 2008

(65) Prior Publication Data

US 2009/0154037 A1  Jun. 18, 2009

Related U.S. Application Data

(63) Continuation-in-part of application No. 11/958,558, filed on Dec. 18, 2007, now abandoned.

(51) Int. Cl.
*G06F 17/50* (2006.01)
*G06F 19/455* (2006.01)
*H01L 23/62* (2006.01)

(52) U.S. Cl. ........ 716/104; 716/101; 716/102; 716/106; 716/109; 716/111; 716/133; 257/360; 257/361; 257/362

(58) Field of Classification Search .................. 716/1, 2, 716/4, 5, 18, 12; 361/56, 58; 257/361, 362
See application file for complete search history.

(56) References Cited

U.S. PATENT DOCUMENTS

| | | | | |
|---|---|---|---|---|
| 5,290,724 A | * | 3/1994 | Leach | 438/234 |
| 5,629,545 A | * | 5/1997 | Leach | 257/362 |
| 5,637,892 A | * | 6/1997 | Leach | 257/362 |
| 5,640,299 A | * | 6/1997 | Leach | 361/56 |
| 6,400,542 B1 | * | 6/2002 | Lee et al. | 361/56 |
| 6,624,998 B2 | * | 9/2003 | May et al. | 361/111 |
| 6,704,179 B2 | * | 3/2004 | Voldman | 361/56 |
| 6,710,983 B2 | * | 3/2004 | Voldman | 360/323 |
| 6,720,625 B2 | * | 4/2004 | Yu | 257/361 |
| 6,888,201 B2 | * | 5/2005 | Yu | 257/361 |
| 7,134,099 B2 | * | 11/2006 | Collins et al. | 716/1 |
| 7,181,352 B2 | * | 2/2007 | Iyer et al. | 702/65 |
| 2010/0175035 A1 | * | 7/2010 | He et al. | 716/5 |
| 2010/0214706 A1 | * | 8/2010 | Crespo et al. | 361/56 |

OTHER PUBLICATIONS

Ker et al.; "Latchup-Like Failure of Power-Rail ESD Clamp Circuits in CMOS Integrated Circuits Under System-Level ESD Test"; Publication Year: 2007; Electromagnetic Compatibility, 2007. EMC 2007. IEEE International Symposium on pp. 1-4.*

Hu et al.; "Gain-controlled CMOS Low Noise Amplifier"; Publication Year: 2006; Solid-State and Integrated Circuit Technology, 2006. ICSICT'06. 8th International Conference on; pp. 1574 -1576.*

* cited by examiner

*Primary Examiner* — Helen Rossoshek
(74) *Attorney, Agent, or Firm* — Scully, Scott, Murphy & Presser, P.C.; Richard M. Kotulak, Esq.

(57) ABSTRACT

A design structure for electrostatic discharge protection comprises a first data representing a first electrostatic discharge (ESD) protection circuit and a second data representing a second ESD protection circuit. A parallel connection of two ESD protection units, each providing a discharge path for electrical charges of opposite types, provides ESD protection circuit for positive and negative voltage swings in the circuit. Each of the multiple emitter-base regions are cascaded such that the base of one emitter-base region is directly wired to the emitter of an adjacent emitter-base region. The first data represents a first ESD protection unit providing protection on one type of voltage swing, and the second data represents a second ESD protection unit providing protection on the other type of voltage swing.

9 Claims, 5 Drawing Sheets

STRUCTURES FOR ELECTROSTATIC DISCHARGE PROTECTION FOR BIPOLAR SEMICONDUCTOR CIRCUITRY

RELATED APPLICATIONS

The present application a continuation-in-part application of a coassigned U.S. application Ser. No. 11/958,558, filed on Dec. 18, 2007 now abandoned, which is incorporated herein by reference.

FIELD OF THE INVENTION

The present invention relates to a design structure for semiconductor structures and circuits, and particularly to a design structure for semiconductor structures and circuits for an electrostatic discharge protection for bipolar semiconductor circuitry including radio frequency (RF) power amplifiers.

BACKGROUND OF THE INVENTION

An electrostatic discharge (ESD) event can occur in a semiconductor chip when a charged conductor (including the human body) discharges through the semiconductor chip. An electrostatic charge may accumulate on a human body, for example, when one walks on a carpet. Contact of a body part, e.g., a finger, to a device containing a semiconductor chip causes the body to discharge, possibly causing damage to the semiconductor device. A similar discharge may occur from a charged conductive object, such as a metallic tool. Static charge may also accumulate on a semiconductor chip through handling or contact with packaging materials or work surfaces.

Such an ESD event can cause failure of components in a semiconductor chip through current overloading or reverse biasing. For example, the propagation of electrical charges through a bipolar transistor may cause an emitter-base junction to become heavily reverse biased, triggering a functional failure of the bipolar transistor in an ESD event. The voltage required for failure is linearly proportional to the area of the emitter of the bipolar transistor. Consequently, the potential for failure increases as circuitry, and therefore the area of the emitter, becomes smaller.

Radio frequency (RF) power amplifiers employing silicon germanium heterojunction bipolar transistors have a large swing in the signal both for positive voltages and negative voltages, typically up to positive 5V and negative 5V. Such RF power amplifiers typically employ dual well bipolar complementary metal oxide semiconductor (BiCMOS) technology. However, electrostatic discharge circuits currently known in the art in the BiCMOS technology are inadequate for providing sufficient protection against ESD events for such RF power amplifiers.

While multi-emitter silicon germanium bipolar transistors having multiple emitter-base regions in parallel connection have been proposed to provided enhanced protection against ESD events, such a device tends to occupy a large area, while improvement in the protection is not substantial. Employing separate devices to form an ESD protection circuit introduces parasitic interaction between collectors as well as increase in the ESD circuit area.

In view of the above, there exists a need for a design structure for a compact and efficient circuit for protection against electrostatic discharge events employing bipolar transistors, which may be employed in radio frequency (RF) power amplifiers employing BiCMOS technology for designing, manufacturing, or testing a design of a semiconductor circuit.

SUMMARY OF THE INVENTION

The present invention addresses the needs described above by providing a design structure for a compact bipolar semiconductor circuit for providing protection against electrostatic discharge events that may be incorporated into circuits with large positive and negative voltage swings.

In the present invention, a design structure for electrostatic discharge protection comprises a first data representing a first electrostatic discharge (ESD) protection circuit and a second data representing a second ESD protection circuit. A parallel connection of two ESD protection units, each providing a discharge path for electrical charges of opposite types, provides ESD protection circuit for positive and negative voltage swings in the circuit. Each of the multiple emitter-base regions are cascaded such that the base of one emitter-base region is directly wired to the emitter of an adjacent emitter-base region. The first data represents a first ESD protection unit providing protection on one type of voltage swing, and the second data represents a second ESD protection unit providing protection on the other type of voltage swing.

According to the present invention, a design structure embodied in a machine readable medium for designing, manufacturing, or testing a design is provided. The design structure comprises a first data representing a first electrostatic discharge (ESD) protection circuit and a second data representing a second ESD protection circuit, wherein the first electrostatic discharge (ESD) protection circuit and the second ESD protection circuit are connected in a parallel connection between a signal path and ground,
wherein the first data includes a third data representing a cascaded plurality of primary bipolar transistors of one transistor type including first through n-th primary bipolar transistors, wherein n is a positive integer equal to or greater than 2, wherein the transistor type is selected from an npn type and a pnp type, wherein a base of the first primary bipolar transistor is connected to ground, wherein an emitter of the n-th primary bipolar transistor is connected to the signal path, and wherein a base of an i-th primary bipolar transistor is connected to an emitter of an (i−1)-th primary bipolar transistor for each value of i between and including 2 and n, and wherein all collectors of the cascaded plurality of primary bipolar transistors are electrically tied, and wherein the second data includes a fourth data representing a cascaded plurality of complementary bipolar transistors of the transistor type including first through m-th complementary bipolar transistors, wherein m is a positive integer equal to or greater than 2, wherein a base of the first complementary bipolar transistor is connected to the signal path, wherein an emitter of the m-th complementary bipolar transistor is connected to the ground, and wherein a base of a k-th complementary bipolar transistor is connected to an emitter of a (k−1)-th complementary bipolar transistor for each value of k between and including 2 and n, and wherein all collectors of the cascaded plurality of complementary bipolar transistors are electrically tied.

DETAILED DESCRIPTION OF THE INVENTION

As stated above, the present invention relates to a design structure for semiconductor structures and circuits for an electrostatic discharge protection for bipolar semiconductor circuitry including radio frequency (RF) power amplifiers, which are now described in detail with accompanying figures. It is noted that like and corresponding elements are referred to by like reference numerals.

Figure 1:
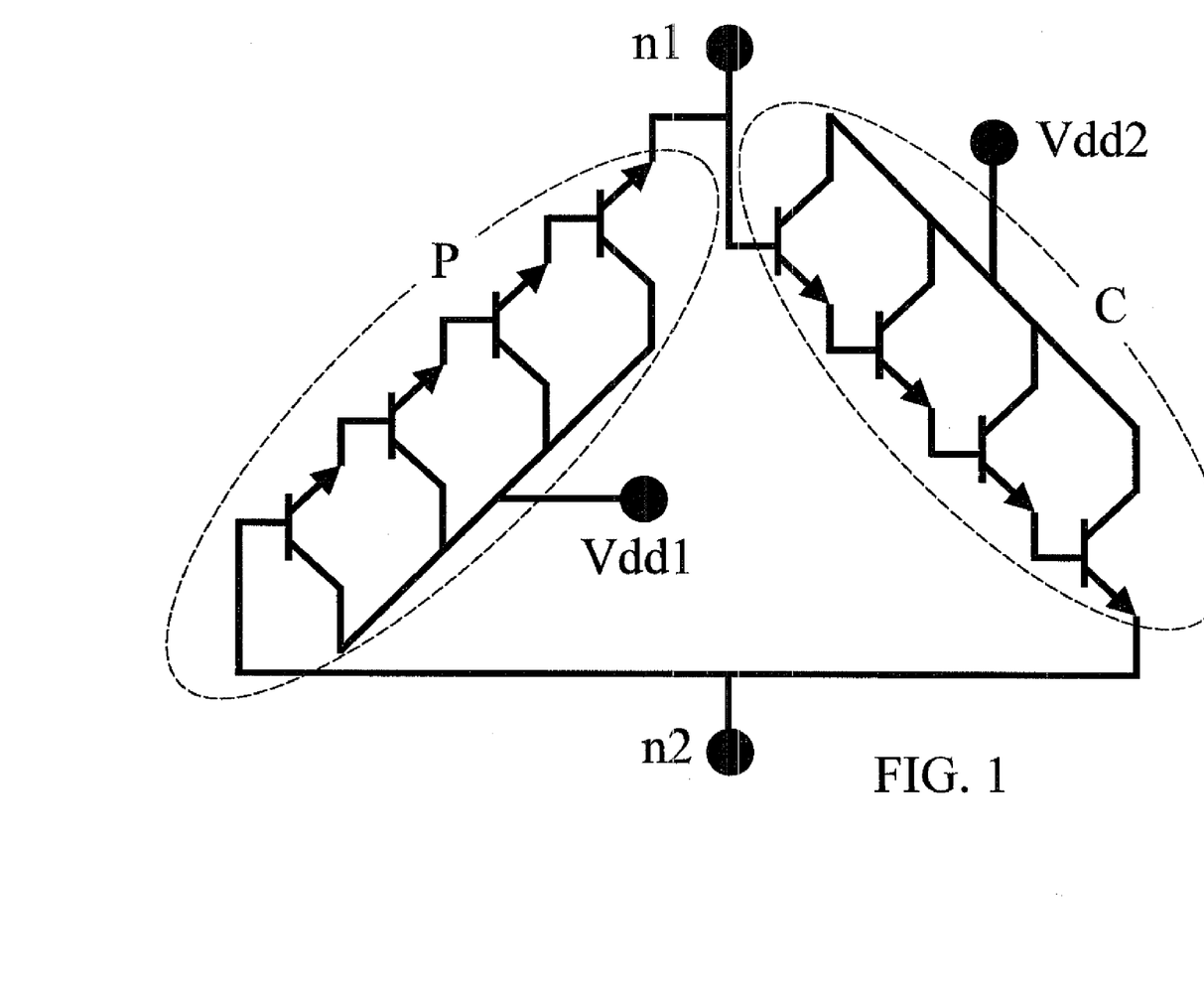
FIG. 1 is a first exemplary semiconductor circuit according to a first embodiment of the present invention.

According to an aspect of the present invention, semiconductor circuits for protection against electrostatic discharge (ESD) events are disclosed. Referring to FIG. 1, a first exemplary semiconductor circuit according to a first embodiment of the present invention comprises a cascaded plurality of primary bipolar transistors P, a cascaded plurality of complementary bipolar transistors C, a first signal node n1, a second signal node n2, a first power supply node, Vdd1, which is connected to collectors of the primary bipolar transistors, and a second power supply node, Vdd2, which connected to collectors of the complementary bipolar transistors. The first exemplary semiconductor circuit is an electrostatic discharge (ESD) protection circuit that provides a discharge path during an ESD event. Preferably, the first signal node n1 is a signal path having a positive and negative voltage swing. In case the first exemplary semiconductor circuit provides electrostatic discharge protection to a circuit containing radio frequency power amplifiers, the voltage on first signal node n1 typically ranges from −5 V to +5 V. Preferably, the second signal node n2 is connected to ground.

While the present invention is described with npn type bipolar transistors, one skilled in the art would readily construct an equivalent version of the first exemplary semiconductor circuit constructed with pnp type bipolar transistors and reversing polarity of voltages on various nodes. Such obvious variations on the first exemplary semiconductor circuit are explicitly contemplated herein.

If the cascaded plurality of primary bipolar transistors P comprises npn transistors as shown in FIG. 1, a positive voltage is supplied to the first power supply node Vdd1. Likewise, if the cascaded plurality of complementary bipolar transistors C comprises npn transistors, a positive voltage is supplied to the second power supply node Vdd2. In this case, not necessarily but preferably, the voltage at the first power supply node Vdd1 and the voltage at the second power supply node Vdd2 are a most positive available voltage on the circuit which the first exemplary semiconductor circuit intends to protect from ESD events.

If the cascaded plurality of primary bipolar transistors P comprises pnp transistors, a negative voltage is supplied to the first power supply node Vdd1. Likewise, if the cascaded plurality of complementary bipolar transistors C comprises pnp transistors, a negative voltage is supplied to the second power supply node Vdd2. In this case, not necessarily but preferably, the voltage at the first power supply node Vdd1 and the voltage at the second power supply node Vdd2 are a most negative available voltage on the circuit which the first exemplary semiconductor circuit intends to protect from ESD events.

The cascaded plurality of primary bipolar transistors P comprises first through n-th primary bipolar transistors, in which n is a positive integer equal to or greater than 2. The first primary bipolar transistor refers to the primary bipolar transistor of which the base is directly connected to the second signal node n2, which is preferably grounded. The n-th primary bipolar transistor refers to the primary bipolar transistor of which the emitter is directly connected to the first signal node n1, which is connected to the signal path. A base of an i-th primary bipolar transistor is connected to an emitter of an (i−1)-th primary bipolar transistor for each value of i between and including 2 and n. All collectors of the cascaded plurality of primary bipolar transistors P are electrically tied to the first power supply node Vdd1. Preferably, all the collectors of the cascaded plurality of primary bipolar transistors P are integrally formed as a single contiguous collector constituting a single device component.

The cascaded plurality of complementary bipolar transistors C comprises first through m-th complementary bipolar transistors, in which m is a positive integer equal to or greater than 2. The first complementary bipolar transistor refers to the complementary bipolar transistor of which the base is directly connected to the first signal node n1, which is connected to the signal path. The m-th complementary bipolar transistor refers to the complementary bipolar transistor of which the emitter is directly connected to the second signal node n2, which is preferably grounded. A base of a k-th complementary bipolar transistor is connected to an emitter of a (k−1)-th complementary bipolar transistor for each value of k between and including 2 and m. All collectors of the cascaded plurality of complementary bipolar transistors C are electrically tied to the second power supply node Vdd2. Preferably, all the collectors of the cascaded plurality of complementary bipolar transistors C are integrally formed as a single contiguous collector constituting a single device component.

In case an ESD event triggers a high negative voltage at the first node n1, the cascaded plurality of primary bipolar transistors P provides a current path for discharge of the negative charge associated with the highly negative voltage. In case an ESD event triggers a high positive voltage at the first node n1, the cascaded plurality of complementary bipolar transistors C provides a current path for discharge of the positive charge associated with the highly positive voltage. Thus, the pair of the cascaded plurality of primary bipolar transistors P and the cascaded plurality of complementary bipolar transistors C in a parallel connection between the first signal node n1 and the second signal node n2 provides protection against ESD events that trigger a large instantaneous charge at the first signal node n1 by providing a conductive discharge path to the second signal node n2, which is typically connected to ground.

Figure 2:
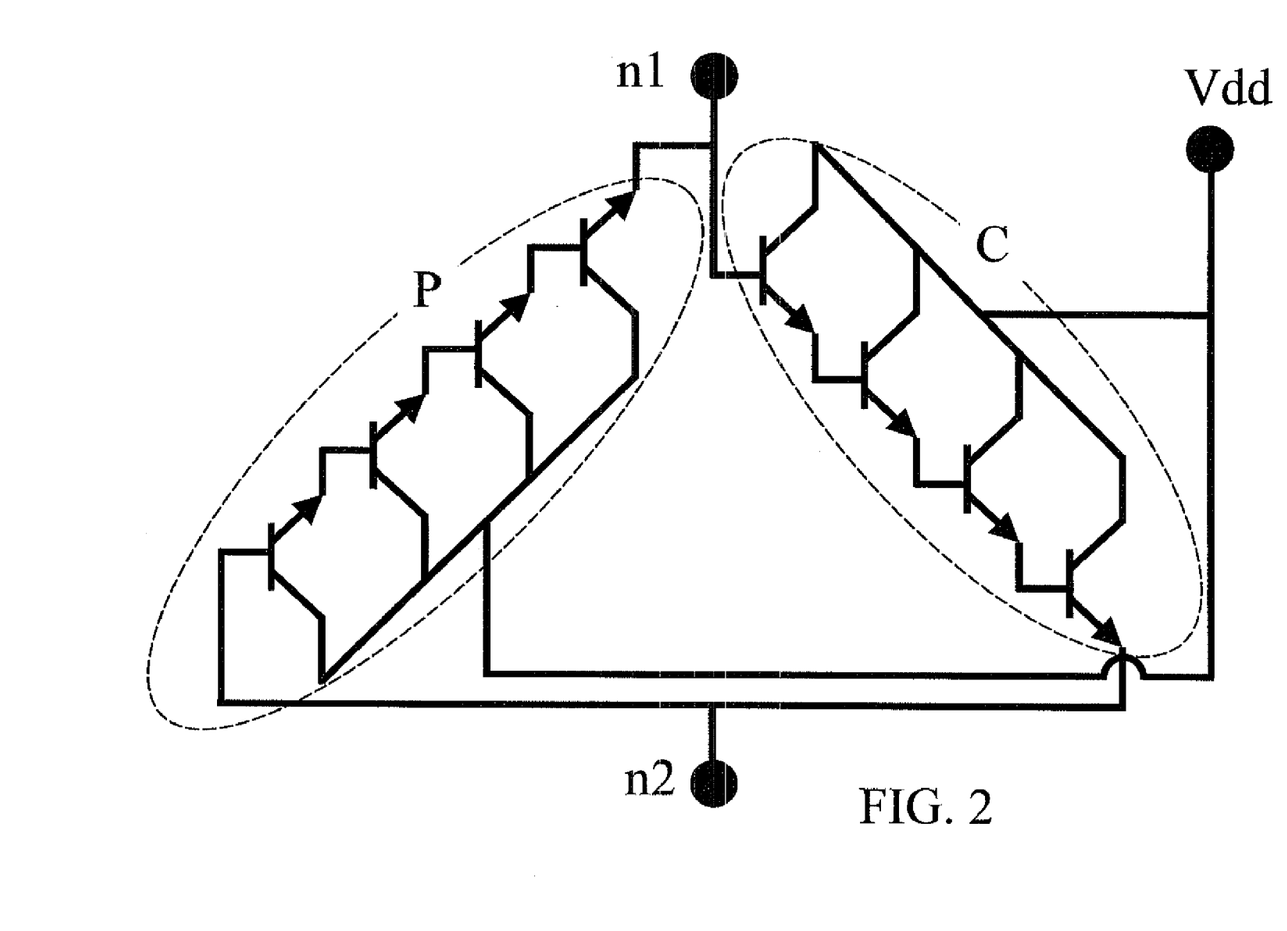
FIG. 2 is a second exemplary semiconductor circuit according to a second embodiment of the present invention.

Referring to FIG. 2, a second exemplary semiconductor circuit according to a second embodiment of the present invention comprises a cascaded plurality of primary bipolar transistors P, a cascaded plurality of complementary bipolar transistors C, a first signal node n1, and a second signal node n2 as in the first exemplary semiconductor circuit. However, a power supply node Vdd is connected to collectors of the primary bipolar transistors and the complementary bipolar transistors, thus replacing the first power supply node, Vdd1 and the second power supply node, Vdd2 of the first exemplary semiconductor circuit. The second exemplary semiconductor circuit is an electrostatic discharge (ESD) protection circuit that provides a discharge path during an ESD event and performs in the same manner as the first exemplary semiconductor circuit.

According to another aspect of the present invention, a semiconductor structure for protection against electrostatic discharge (ESD) is provided, which comprises a first ESD protection structure and a second ESD protection structure that are connected in a parallel connection between a signal path and ground. An equivalent circuit for the semiconductor structure may be the first exemplary semiconductor circuit or the second exemplary semiconductor circuit described above. The signal path corresponds to the first signal node n1, and the ground corresponds to the second signal node n2. The first ESD protection structure and the second ESD protection structure are formed on the same semiconductor substrate, and preferably within the same semiconductor chip.

Figure 3:
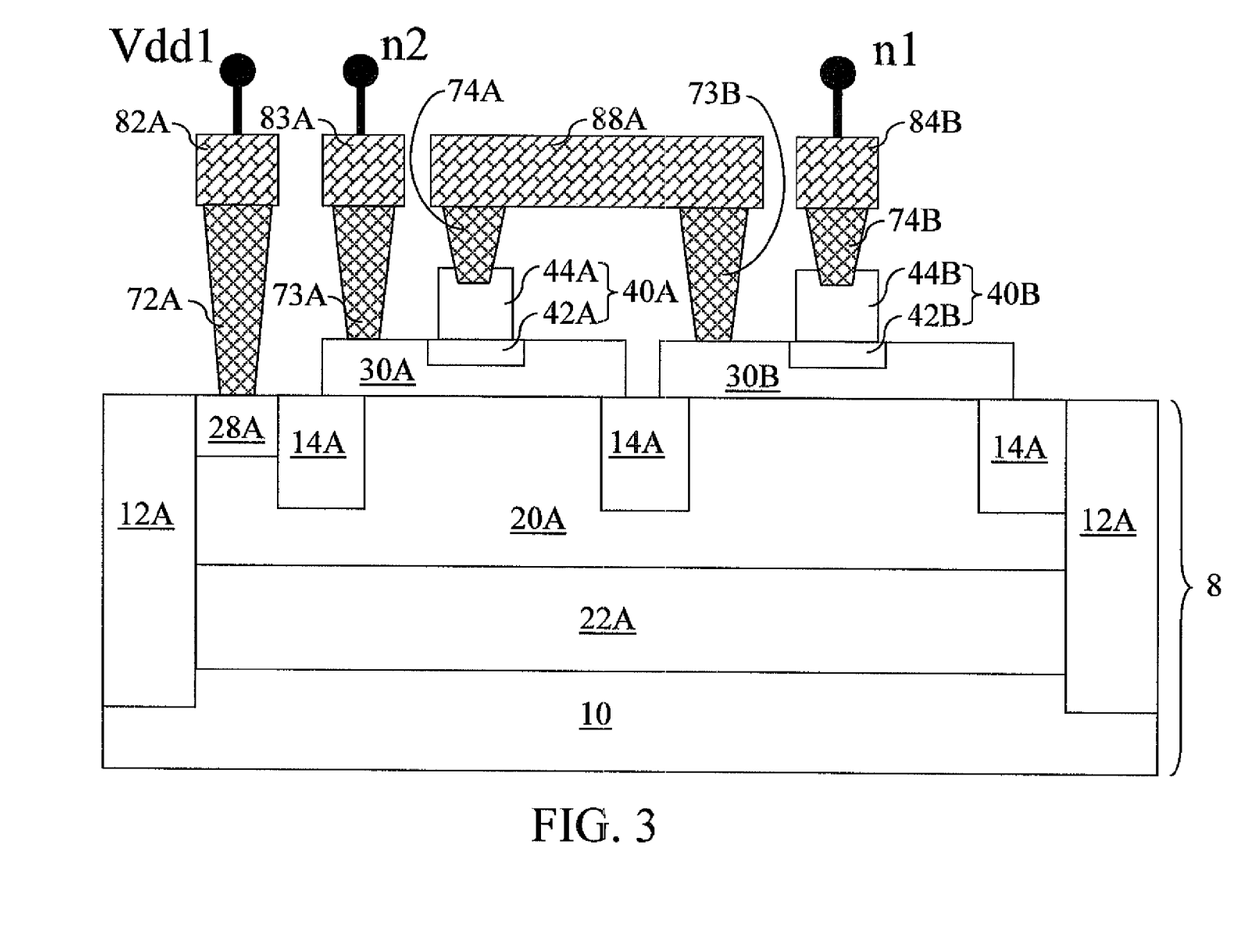
FIG. 3 is a first exemplary ESD protection structure that forms a part of an exemplary semiconductor structure according to the present invention.

Referring to FIG. 3, a vertical cross-sectional view of an exemplary first ESD protection structure according to the present invention is shown along with schematic representations to connections to a first signal node n1, a second signal node n2, and a first power supply node Vdd1, each of which functionally corresponds to the same element in the first exemplary semiconductor circuit of FIG. 1 having the same name. The exemplary first ESD protection structure comprises a semiconductor substrate 8 comprising a substrate layer 10, first deep trench isolation structures 12A, first shallow trench isolation structures 14A, a first subcollector 22A, a first collector 20A, and a first collector reachthrough 28A.

The first subcollector 22A has a doping of a first conductivity type, which may be p-type or n-type, and is formed by implantation of dopants of the first conductivity type into the semiconductor substrate 8. The first subcollector 22A is heavily doped to reduce resistance, and has a dopant concentration from about $1.0 \times 10^{19}/cm^3$ to about $1.0 \times 10^{21}/cm^3$. The first deep trench isolation structures 12A are formed by forming deep trenches in the semiconductor substrate 8, and filling them with an insulator material such as silicon oxide and undoped polysilicon. The first shallow trench isolation structures 14A are formed by forming shallow trenches and filling them with an insulator material such as silicon oxide and/or silicon nitride. Typically, the first deep trench isolation structures 12A extend beneath a bottom surface of the first subcollector 22A. The bottom surfaces of the first shallow trench isolation structures 14A are located above the depth of the top surface of the first subcollector 22A. Thus, the first collector 20A is of unitary construction, i.e., in one contiguous piece.

The first collector 20A has a doping of the first conductivity type. The first collector reachthrough 28A also has a doping of the first conductivity type, and typically has a higher dopant concentration than the first collector 20A to reduce its resistance.

In general, a first ESD semiconductor structure comprises a plurality of first emitter-base regions that are formed directly on the first collector 20A. Each of the first emitter-base regions comprises an emitter having a doping of the first conductivity type and a base having a doping of a second conductivity type, which is the opposite of the first conductivity type. For example, if the first conductivity type is n-type, the second conductivity type is p-type, and vice versa. A first interconnect structure connects a base of one of the plurality of the first emitter-base regions to a second signal node, which is connected to ground. A second interconnect structure connects an emitter of another of the plurality of the first emitter-base regions to the first signal node, which is connected to a signal path. At least one third interconnect structure connects a base of each of the plurality of the first emitter-base regions that is not connected to the first interconnect structure to an emitter of another of the plurality of the first emitter-base regions so that all of the first emitter-base regions are cascaded.

In the case of the exemplary first ESD semiconductor structure in FIG. 3, the first emitter-base regions comprise an "emitter-base region A" and an "emitter-base region B." It is noted herein that an alphabetical suffix to a device component herein refers to an instance of such a device component, and that the alphabetical suffix is employed for the purpose of differentiating multiple instances of the device component. Thus, each of the "emitter-base region A" and the "emitter-base region B" is a distinct emitter-base region. The emitter-base region A comprises an "emitter A" 40A that comprises a "polycrystalline emitter A" 44A which comprises a polycrystalline semiconductor material having a doping of the first conductivity type and a "single crystalline emitter A" 42A which comprises a single crystalline semiconductor material having a doping of the first conductivity type. The emitter-base region A also comprises a "base A" 30A that comprises a single crystalline semiconductor material having a doping of the second conductivity type Likewise, the emitter-base region B comprises an "emitter B" 40B that comprises a "polycrystalline emitter B" 44B which comprises a polycrystalline semiconductor material having a doping of the first conductivity type and a "single crystalline emitter B" 42B which comprises a single crystalline semiconductor material having a doping of the first conductivity type. The emitter-base region B also comprises a "base B" 30B that comprises a single crystalline semiconductor material having a doping of the second conductivity type. A typical material for the polycrystalline emitter A (44A) and the polycrystalline emitter B (44B) is polysilicon. A typical material for the base A (30A) and base B (30B) is a silicon germanium alloy.

A base contact via 73A and a base contact metal line 83A collectively constitute a first interconnect structure that connects the base A (30A) of the emitter-base region A to the second signal node n2, which is connected to ground. An emitter contact via 74B and an emitter contact metal line 84B collectively constitute a second interconnect structure that connects the emitter B (40B) of the emitter-base region B to the first signal node, which is connected to the signal path. The base B (30B) of the emitter-base region B, which is not connected to the first interconnect structure (73A, 83A), is connected to the emitter A (40A) of the emitter-base region A by a third interconnect structure. The third interconnect structure comprises a contact via 73B to the base B (30B) of the emitter-base region B, a metal line 88A, and another contact via 74A to the emitter A (40A) of the emitter-base region A. Thus, all of the first emitter-base regions including the emitter-base region A and the emitter-base region B are cascaded.

Yet another contact via 72A directly contacting the first collector reachthrough 28A and another metal line 82A contacting the yet another contact via 72A provide an electrical connection between the first collector reachthrough 28A and the first supply voltage node Vdd1 to electrically bias the exemplary first ESD semiconductor structure and render it operational in a forward bias mode. The exemplary first ESD semiconductor structure functions as the cascaded plurality of primary bipolar transistors P in FIGS. 1 and 2. Note that use of a common supply voltage node Vdd instead of two separate supply voltage nodes transforms the first exemplary semiconductor circuit into the second exemplary semiconductor circuit.

The exemplary first ESD semiconductor structure may be readily modified to include more than two emitter-base regions as described above for general cases, in which multiple cascoding is effected by connecting each base that is not connected to the second signal node n2 to an emitter of an adjacent emitter-base region as described by the cascaded plurality of primary bipolar transistors P in FIGS. 1 and 2.

Figure 4:
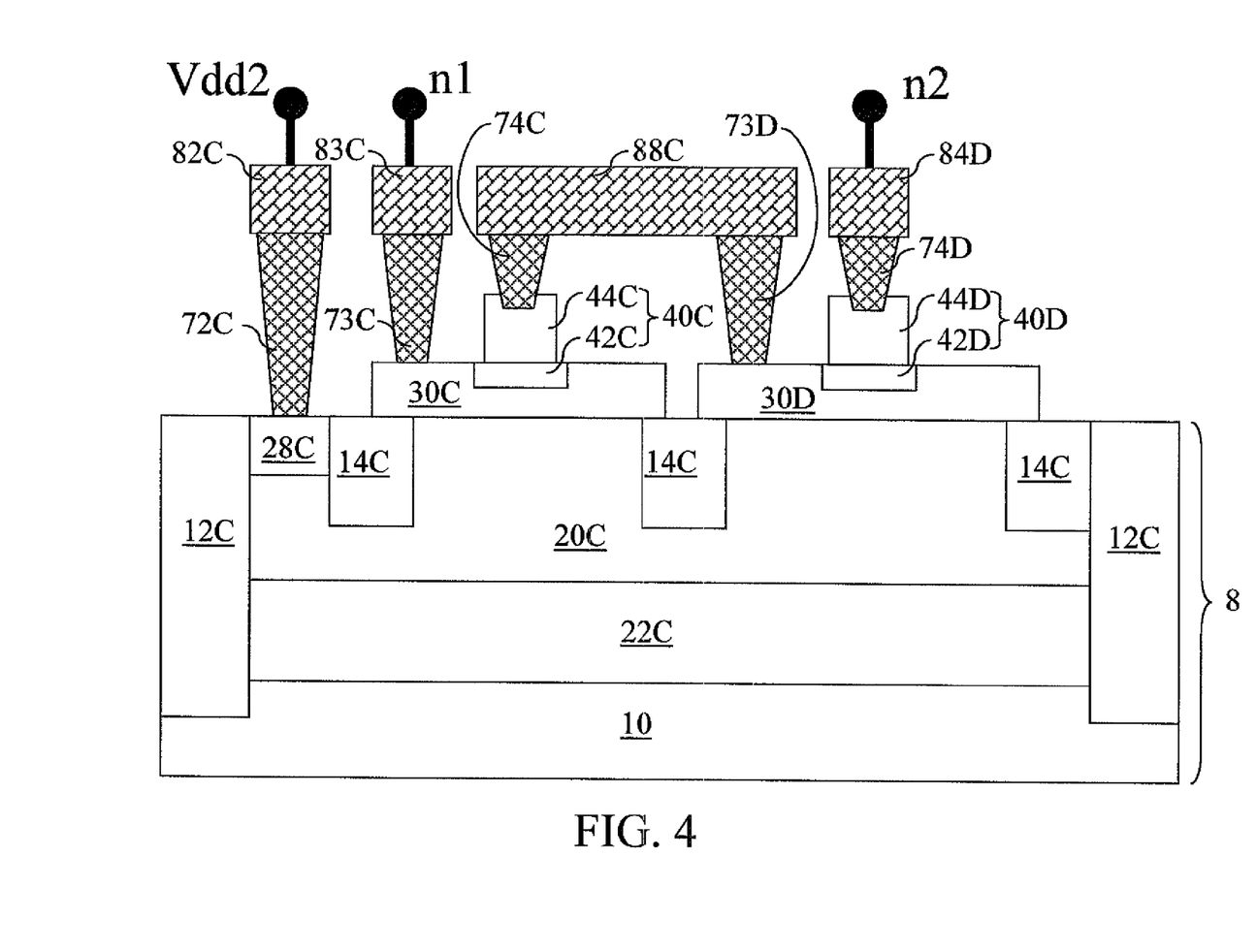
FIG. 4 is a second exemplary ESD protection structure that forms another part of the exemplary semiconductor structure according to the present invention.

Referring to FIG. 4, a vertical cross-sectional view of an exemplary second ESD protection structure according to the present invention is shown along with schematic representations to connections to a first signal node n1, a second signal node n2, and a second power supply node Vdd1, each of which functionally corresponds to the same element in the first exemplary semiconductor circuit of FIG. 1 having the same name. The exemplary second ESD protection structure comprises a semiconductor substrate 8 comprising the substrate layer 10, second deep trench isolation structures 12C, second shallow trench isolation structures 14C, a second subcollector 22C, a second collector 20C, and a second collector reachthrough 28C.

The second subcollector 22C has a doping of the first conductivity type, which is the same conductivity type of the doping of the first subcollector 22A of FIG. 3, and is formed by implantation of dopants of the first conductivity type into the semiconductor substrate 8. The second subcollector 22C is heavily doped to reduce resistance, and has a dopant concentration from about $1.0 \times 10^{19}/cm^3$ to about $1.0 \times 10^{21}/cm^3$. The first and second subcollectors (22A, 22C) may be formed at a same processing step. The second deep trench isolation structures 12C are formed by forming deep trenches in the semiconductor substrate 8, and filling them with an insulator material such as silicon oxide and undoped polysilicon. The first and second deep trench isolation structures (12A, 12C) may be formed at a same processing step. The second shallow trench isolation structures 14C are formed by forming shallow trenches and filling them with an insulator material such as silicon oxide and/or silicon nitride. The first and second shallow trench isolation structures (14A, 14C) may be formed at a same processing step. Typically, the second deep trench isolation structures 12C extend beneath a bottom surface of the second subcollector 22C. The bottom surfaces of the second shallow trench isolation structures 14C are located above the depth of the top surface of the second subcollector 22C. Thus, the second collector 20C is of unitary construction, i.e., in one contiguous piece.

The second collector 20C has a doping of the first conductivity type. The second collector reachthrough 28C also has a doping of the first conductivity type, and typically has a higher dopant concentration than the second collector 20C to reduce its resistance.

In general, a second ESD semiconductor structure comprises a plurality of second emitter-base regions that are formed directly on the second collector 20C. Each of the second emitter-base regions comprises an emitter having a doping of the first conductivity type and a base having a doping of the second conductivity type. A fourth interconnect structure connects a base of one of the plurality of the second emitter-base regions to the first signal node, which is connected to the signal path. A fifth interconnect structure connects an emitter of another of the plurality of the second emitter-base regions to the second signal node, which is connected to ground. At least one sixth interconnect structure connects a base of each of the plurality of the second emitter-base regions that is not connected to the fourth interconnect structure to an emitter of another of the plurality of the second emitter-base regions so that all of the second emitter-base regions are cascaded.

In the case of the exemplary second ESD semiconductor structure in FIG. 4, the second emitter-base regions comprise an "emitter-base region C" and an "emitter-base region D." The emitter-base region C comprises an "emitter C" 40C that comprises a "polycrystalline emitter C" 44C which comprises a polycrystalline semiconductor material having a doping of the first conductivity type and a "single crystalline emitter C" 42C which comprises a single crystalline semiconductor material having a doping of the first conductivity type. The emitter-base region C also comprises a "base C" 30C that comprises a single crystalline semiconductor material having a doping of the second conductivity type Likewise, the emitter-base region D comprises an "emitter D" 40D that comprises a "polycrystalline emitter D" 44D which comprises a polycrystalline semiconductor material having a doping of the first conductivity type and a "single crystalline emitter D" 42D which comprises a single crystalline semiconductor material having a doping of the first conductivity type. The emitter-base region D also comprises a "base D" 30D that comprises a single crystalline semiconductor material having a doping of the second conductivity type. A typical material for the polycrystalline emitter C (44C) and the polycrystalline emitter D (44D) is polysilicon. A typical material for the base C (30C) and base D (30D) is a silicon germanium alloy.

A base contact via 73C and a base contact metal line 83C collectively constitute a fourth interconnect structure that connects the base C (30C) of the emitter-base region A to the first signal node n1, which is connected to the signal path. An emitter contact via 74D and an emitter contact metal line 84D collectively constitute a fourth interconnect structure that connects the emitter D (40D) of the emitter-base region D to the second signal node, which is connected to ground. The base D (30D) of the emitter-base region D, which is not connected to the fourth interconnect structure (73C, 83C), is connected to the emitter C (40C) of the emitter-base region C by a sixth interconnect structure. The third interconnect structure comprises a contact via 73B to the base B (30B) of the emitter-base region B, a metal line 88A, and another contact via 74A to the emitter A (40A) of the emitter-base region A. Thus, all of the second emitter-base regions including the emitter-base region C and the emitter-base region D are cascade.

Yet another contact via 72C directly contacting the second collector reachthrough 28C and another metal line 82C contacting the yet another contact via 72C provide an electrical connection between the second collector reachthrough 28C and the second supply voltage node Vdd2 to electrically bias the exemplary second ESD semiconductor structure and render it operational in a forward bias mode. The exemplary second ESD semiconductor structure functions as the cascaded plurality of complementary bipolar transistors P in FIGS. 1 and 2. Note that use of a common supply voltage node Vdd instead of two separate supply voltage nodes transforms the first exemplary semiconductor circuit into the second exemplary semiconductor circuit.

The exemplary second ESD semiconductor structure may be readily modified to include more than two emitter-base regions as described above for general cases, in which multiple cascoding is effected by connecting each base that is not connected to the first signal node n1 to an emitter of an adjacent emitter-base region as described by the cascaded plurality of complementary bipolar transistors C in FIGS. 1 and 2.

Figure 5:
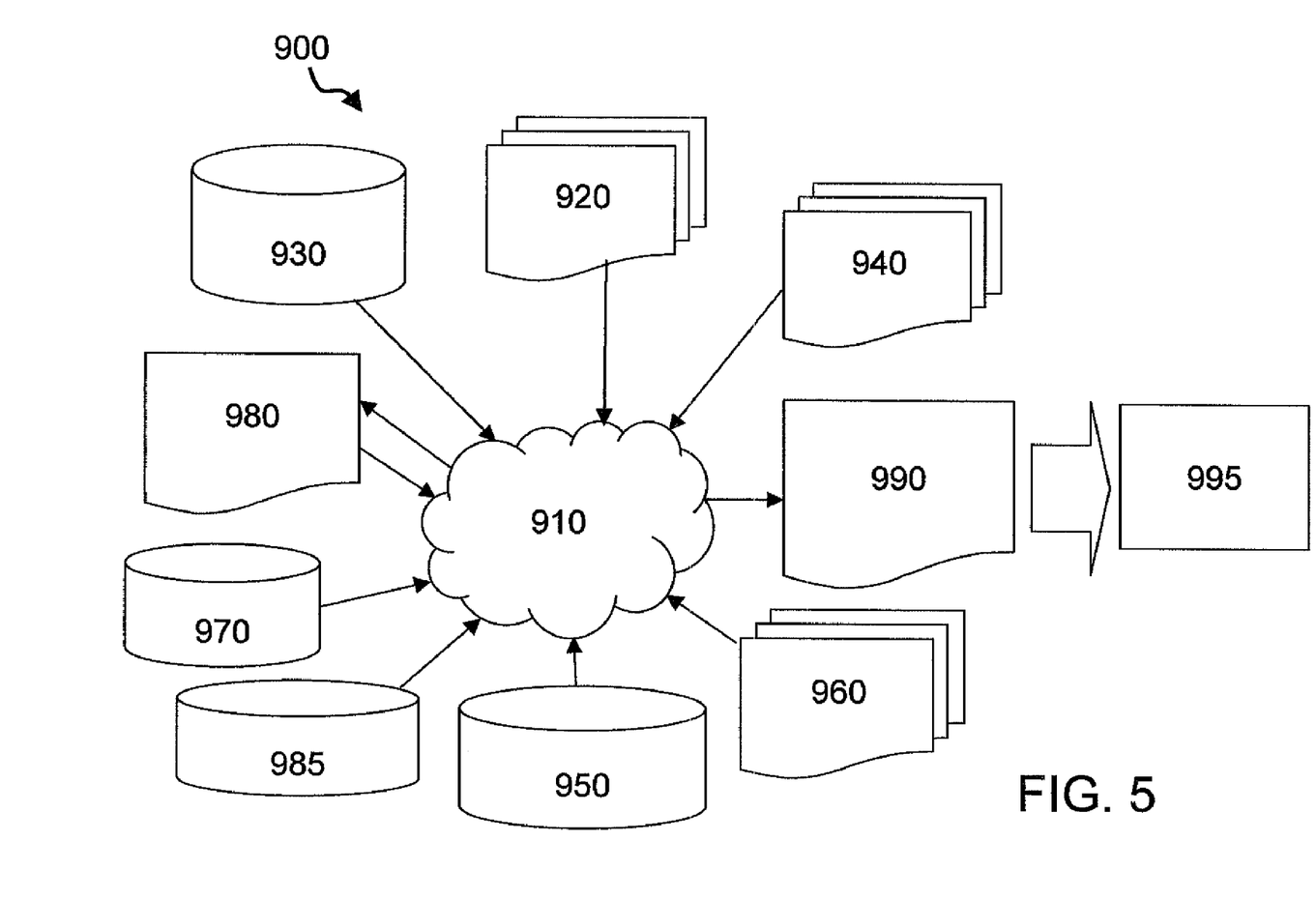
FIG. 5 is a flow diagram of a design process used in semiconductor design and manufacture of the semiconductor circuits according to the present invention.

FIG. 5 shows a block diagram of an exemplary design flow 900 used for example, in semiconductor design and manufacturing of the semiconductor circuit according to the present invention. Design flow 900 may vary depending on the type of integrated circuit (IC) being designed. For example, a design flow for building an application specific integrated circuit (ASIC) may differ from a design flow for designing a standard integrated circuit component. Design structure 920 is preferably an input to a design process 910 and may come from an intellectual property (IP) provider, a core developer, or a design company, or may be generated by the operator of a design flow, or may come from other sources.

Design structure 920 comprises an embodiment of present invention as shown in any of FIGS. 1-4 in the form of schematics or hardware description language (HDL; e.g. Verilog, VHDL, C, etc.) The design structure 920 may be contained on one or more machine readable medium. For example, design structure 920 may be a text file or a graphical representation of an embodiment of the invention as shown in FIGS. 1-4.

Design process 910 preferably synthesizes (or translates) an embodiment of the invention as show in FIGS. 1-4 into a netlist 980, where netlist 980 is, for example, a list of metal light shields, wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which the netlist 980 is resynthesized one or more times depending on design specifications and parameters for the circuit.

The design process 910 may include using a variety of inputs; for example, inputs from library elements 930 which may house a set of commonly used elements, circuits, and devices, including models, layouts, and symbolic representations, for a given manufacturing technology (e.g., different technology nodes such as 32 nm, 45 nm, and 90 nm, etc.), design specifications 940, characterization data 950, verification data 960, design rules 970, and test data files 985 (which may include, for example, standard circuit design processes such as timing analysis, verification, design rule checking, place and route operations, etc. One of ordinary skill in the art of integrated circuit design can appreciate the extent of possible electronic design automation tools and applications used in the design process 910 without deviating from the scope and spirit of the present invention. The design structure of the present invention is not limited to any specific design flow.

Design process 910 preferably translates an embodiment of the invention as shown in FIGS. 1-4, along with any additional integrated circuit deign or data (if applicable), into a second design structure 990. Design structure 990 resides on a storage medium in a data format used for the exchange of layout data of integrated circuits and/or symbolic data format (e.g., information stored in GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing though the manufacturing line, and any other data required by a semiconductor manufacturer to produce one of the embodiments of the present invention as shown in FIGS. 1-4. Design structure 990 may then proceed to a stage 995 where, for example, design structure 990 proceeds to tape-out, is released to manufacturing, is released to a mask house, is sent to another design house, is sent back to a customer, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A non-transitory machine readable storage medium for designing, manufacturing, or testing a design, said non-transitory machine readable storage medium embodying a design structure, said design structure comprising a first data representing a first electrostatic discharge (ESD) protection circuit and a second data representing a second ESD protection circuit, wherein said first electrostatic discharge (ESD) protection circuit and said second ESD protection circuit are connected in a parallel connection between a signal path and ground;

wherein said first data includes a third data representing a cascaded plurality of primary bipolar transistors of one transistor type including first through n-th primary bipolar transistors, wherein n is a positive integer equal to or greater than 2, wherein said transistor type is selected from an npn type and a pnp type, wherein a base of said first primary bipolar transistor is connected to ground, wherein an emitter of said n-th primary bipolar transistor is connected to said signal path, and wherein a base of an i-th primary bipolar transistor is connected to an emitter of an (i−1)-th primary bipolar transistor and not connected to any power supply node for each integer i labeling said cascaded plurality of primary bipolar transistors and having a value between and including 2 and n, and wherein all collectors of said cascaded plurality of primary bipolar transistors are electrically tied; and wherein said second data includes a fourth data representing a cascaded plurality of complementary bipolar transistors of said transistor type including first through m-th complementary bipolar transistors, wherein m is a positive integer equal to or greater than 2, wherein a base of said first complementary bipolar transistor is connected to said signal path, wherein an emitter of said m-th complementary bipolar transistor is connected to said ground, and wherein a base of a k-th complementary bipolar transistor is connected to an emitter of a (k−1)-th complementary bipolar transistor and not connected to any power supply node for each integer k labeling said cascaded plurality of complementary bipolar transistors and having a value between and including 2 and m, and wherein all collectors of said cascaded plurality of complementary bipolar transistors are electrically tied.

2. The non-transitory machine readable storage medium of claim 1, wherein said design structure comprises a netlist.

3. The non-transitory machine readable storage medium of claim 1, wherein said design structure resides on storage medium as a data format used for exchange of layout data of integrated circuits.

4. The non-transitory machine readable storage medium of claim 1, wherein all collectors of said cascaded plurality of primary bipolar transistors are electrically tied to a first power supply node.

5. The non-transitory machine readable storage medium of claim 1, wherein all collectors of said cascaded plurality of complementary bipolar transistors are electrically tied to a second power supply node.

6. The non-transitory machine readable storage medium of claim 1, wherein all collectors of said cascaded plurality of primary bipolar transistors are electrically tied to a first power supply node, all collectors of said cascaded plurality of complementary bipolar transistors are electrically tied to a second power supply node, and said first power supply node and said second power supply node provide different voltages.

7. The non-transitory machine readable storage medium of claim 6, wherein said first power supply node and said second power supply node supply a most positive voltage available in a circuit that said first ESD protection circuit and said second ESD protection circuit are designed to protect.

8. The non-transitory machine readable storage medium of claim 1, wherein all collectors of said cascaded plurality of primary bipolar transistors and all collectors of said cascaded plurality of complementary bipolar transistors are electrically tied to a power supply node.

9. The non-transitory machine readable storage medium of claim 8, wherein said power supply node supplies a most positive voltage available in a circuit that said first ESD protection circuit and said second ESD protection circuit are designed to protect.

* * * * *